United States Patent
Peake

(10) Patent No.: US 6,780,722 B2
(45) Date of Patent: Aug. 24, 2004

(54) FIELD EFFECT TRANSISTOR ON INSULATING LAYER AND MANUFACTURING METHOD

(75) Inventor: Steven T. Peake, Warrington (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/265,579

(22) Filed: Oct. 7, 2002

(65) Prior Publication Data

US 2003/0080380 A1 May 1, 2003

(30) Foreign Application Priority Data

Nov. 1, 2001 (GB) .............................. 0126215

(51) Int. Cl.[7] .............................. H01L 21/336
(52) U.S. Cl. .................... 438/301; 438/527
(58) Field of Search .............. 438/149, 299, 438/301, 303, 305, 306, 506, 517, 519, 522–3, 527, 9, 530

(56) References Cited

U.S. PATENT DOCUMENTS 4,677,735 A * 7/1987 Malhi .......................... 438/154
5,268,586 A * 12/1993 Mukherjee et al. .......... 257/335
2003/0008465 A1 * 1/2003 Chen .......................... 438/306

FOREIGN PATENT DOCUMENTS

| EP | 0638938 A2 | 2/1995 | |
| WO | WO9607200 | 7/1996 | H01L/21/265 |

OTHER PUBLICATIONS

"SOI LIGBT Devices with a Dual P–Well Implant for Improved Latching Characteristics", by D.R. Disney et al., May, 1993, pp. 254–258.

* cited by examiner

Primary Examiner—Wael Fahmy
Assistant Examiner—Ginette Peralta
(74) Attorney, Agent, or Firm—Aaron Waxler

(57) ABSTRACT

A field effect transistor has source 12, body 10 and drain 8 formed on an insulating layer 4. Implant regions 40 are implanted under the source 12, laterally aligned with the source 12 by implantation through opening in the source mask. The ruggedness of the transistor may thereby be improved without affecting the doping in channel region 19.

9 Claims, 3 Drawing Sheets

FIELD EFFECT TRANSISTOR ON INSULATING LAYER AND MANUFACTURING METHOD

The invention relates to a transistor formed on an insulating layer, especially a silicon-on-insulator transistor and method of its manufacture, and in particular to a method of improving ruggedness.

An example of a Silicon-on-Insulator design is shown in FIG. 1. A buried oxide layer 4 is formed on substrate 2, and an active semiconductor layer 6 on the buried oxide layer 4. An n-type drain region 8, p-type body region 10 and source region 12 are defined in the active semiconductor layer 6. The drain region 8 is divided into a relatively lightly doped drift region 14 and a heavily doped contact region 16. A polysilicon gate 18 is provided above the active layer 6 separated from the active layer 6 by a gate insulator 20. A source metallisation 22 contacts the source and a drain metallisation 24 contacts the drain.

A problem in FETs is the existence of parasitic bipolar transistors, formed from the source, body and drain regions. Referring to FIG. 1, the source 12, body 10 and drain 8 form the emitter, base and collector of the parasitic transistor. By shorting the source 12 and body 10, together, for example by connecting both to the source metallisation 22 as shown, the emitter and base of the parasitic transistor are shorted together which suppresses the parasitic bipolar transistor.

However, under high current conditions sufficient current may flow through the body region 10 past the source region to the metallisation that a voltage is dropped in the body region under the source region 12 between lower corners 26,28 of the source region. If this voltage is high enough, the voltage is sufficient to forward bias the parasitic transistor.

High current may occur under conditions of unclamped inductive turn-off, or very high voltage rates of change. Resistance to turning on of the parasitic bipolar transistor in these conditions is known as "ruggedness".

Even if failure does not occur, the voltage needed to trigger the parasitic in subsequent events will be reduced by the high temperatures, leading to a more rapid turn on of the parasitic transistor. After a number of events the device may fail as the hot spot gets hotter and hotter in each event.

An p-type implant 30 may be provided in the upper part of the body region 10 adjacent to the source region 12. This can provide a lower resistance path, reducing the voltage drop between corners 26, 28 in high current conditions and so reducing the propensity of the parasitic transistor to turn on.

An alternative example of a FET is described in WO 96/07200 to International Rectifier Corporation in which the whole p-type body and the n-type source are deposited through a single mask hole.

Unfortunately, in this prior design the p-type implant affects the doping of the body region just under the gate 18, and accordingly makes it very difficult to arrange suitable channel doping. WO 96/07200 states that "proper selection of diffusion parameters will prevent the P+ doping from reaching the surface channel regions in sufficient quantity to substantially change the threshold voltage", but does not appear to provide detailed instructions of how the diffusion parameters are to be selected. Indeed, it is hard to see how it is possible to provide highly doped p+ and lower doped p regions from a single implant and diffusion without also having a very uneven doping concentration along the channel. Process variation would result in threshold voltage variation and it is hard to see how these could be compensated for.

Accordingly, it would be beneficial to improve the ruggedness of a field effect transistor without significantly affecting the channel doping or greatly increasing process complexity.

According to the invention there is provided a method of manufacturing a field effect transistor including: providing body and drain semiconductor regions laterally adjacent on an insulating layer; defining a source region mask having openings over part of the body region; implanting through the openings an implant region of the same conductivity type as the body region and more highly doped than the body region; implanting through the openings a source region of opposite conductivity type to the body region at the surface of the body region laterally aligned with the implant region; and activating the source and implant regions.

The invention also relates to a field effect transistor comprising an insulating layer; an active semiconductor layer over the insulating layer, the active semiconductor layer including a body semiconductor region laterally of a drain semiconductor region; a source region of opposite conductivity type to body region implanted at the surface of the body region; and an implant region doped to have the same conductivity type as the body region but higher doping concentration substantially laterally aligned with the source region and extending in the vertical direction below the source region.

The implant region under the source region is highly doped and accordingly reduces voltage drop caused by any lateral current flowing under the source region in the body region. The pn junction between source and body is accordingly less susceptible to becoming strongly forward biased, whereby the ruggedness of the transistor is improved.

The inventors have realised that by defining the bulk of the body region including the channel in a first step and the implant region using the source mask in a second step it is possible to get good ruggedness protection without the need for excessive numbers of masks and corresponding alignment steps.

The process has significant advantages over the prior p-type implant approach illustrated in FIG. 1. For example, it is possible to obtain a highly p-type doped implant region adjacent to the source region without upsetting the doping in the channel region and thereby degrading the threshold voltage. The channel doping can be selected as in a conventional device by selecting the doping of the bulk body region without needing to arrange in the same step that a highly doped p-type region is provided in the correct location.

The implant region can be implanted using the same mask as the source metallisation, avoiding the need for a separate mask step.

It is possible to heat up and activate the implant region.

Moreover, by using the approach of the invention it is possible to provide an implant region extending from the insulating layer to the source region. This means that all of the breakdown current under the source, which is largely lateral in SOI devices, passes through the high doping density and accordingly low resistance implant region. This reduces the chance of generating large voltages that may turn on the parasitic bipolar transistor. Referring to prior art FIG. 1 breakdown may occur at corner 32 of implant 30. By extending the implant region all the way from the insulating layer to the source such corners in the implant region are avoided.

It is preferred that the source implant and implant region are activated together after they are both formed. This avoids any need for a separate activation step to activate the p implant, and also avoids increasing the thermal budget of the process, i.e. avoids adding extra heating steps.

It is thus preferred that the activation step does not cause significant diffusion of the p implant. However, in alterative embodiments the activation step may be a diffusion step which may be beneficial to round off the edges of the implant region, and possibly also the source region.

For a better understanding of the invention, and purely by way of example, a specific embodiment of the invention will now be described with reference to the accompanying drawings, in which.

Like or corresponding components are given like reference numerals in different figures. The figures are schematic and not to scale.

Figure 1:
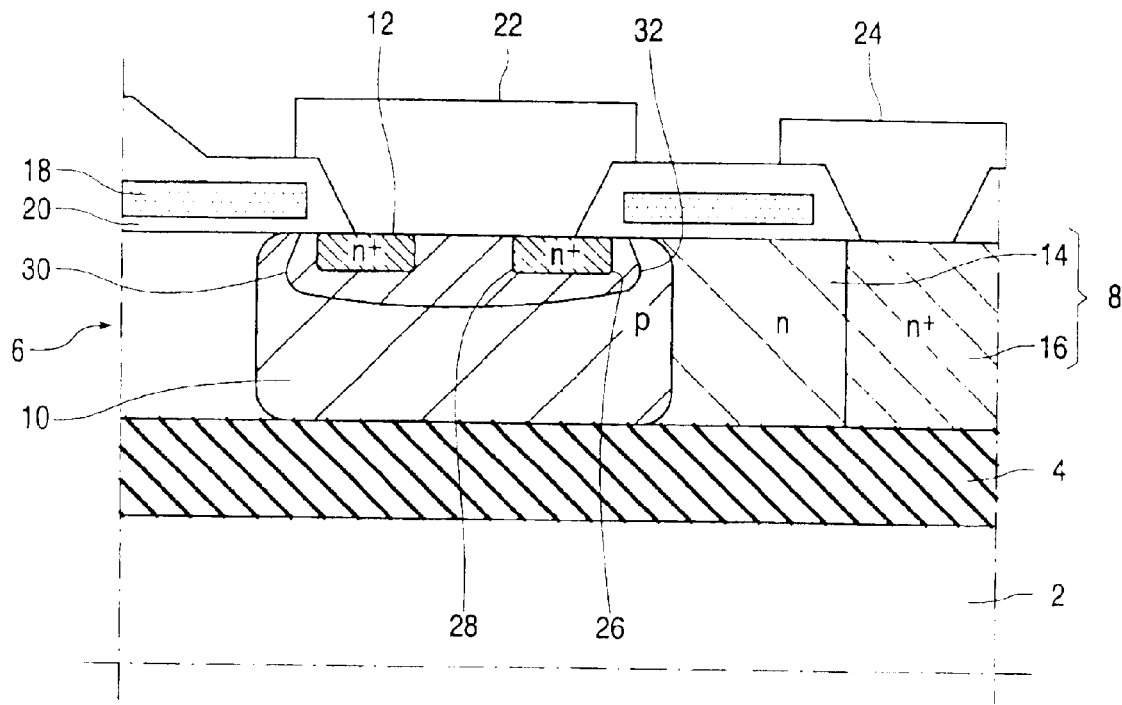
FIG. 1 shows a conventional field effect transistor.
Figure 2:
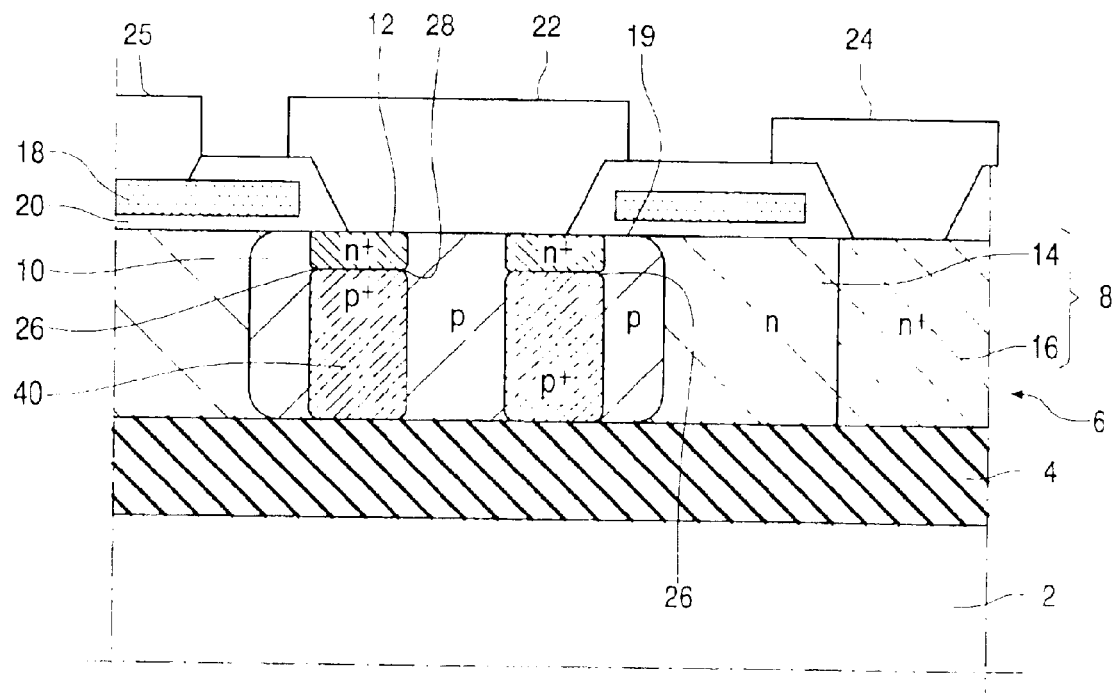
FIG. 2 shows a field effect transistor according to an embodiment of the invention.

Referring to FIG. 2, a buried oxide layer 4 is provided on substrate 2, and active layer 6 extends laterally over the buried oxide layer 4. The active layer includes a drain region 8, body region 10 and a source region 12 at the upper surface of the body region. The drain 8 and source 12 are doped n-type and the body p-type. The drain region 8 is divided between a drift region 14 and a drain contact region 16 of higher doping concentration.

A polysilicon gate 18 extends over the body region 10 and part of the drain region 8 separated from the body region by a gate insulator 20. Source 22, drain 24 and gate 25 electrodes contact the source region 12, gate 18 and drain contact region 16. The source electrode 22 also makes contact to the body region 10. This reduces the effects of the parasitic bipolar transistor formed by the n type source, p type body and n type drain.

Channel region 19 is the part of the body region 10 under the gate 18.

A highly doped p+ implant region 40 is provided laterally aligned with the source 12 and extending between the source 12 and the buried layer 4.

In use, with current flowing laterally from the drain 8 to the source electrode 22, the p+ implant keeps the outer corner 26 of the source region shorted. In other words, lateral current flowing under the source 12 does not drop a large voltage as it flows under the source since the implant region is highly doped and accordingly of low resistance. This substantially prevents turn-on of the parasitic bipolar capacitor and enhances the ruggedness of the device.

Figure 3:
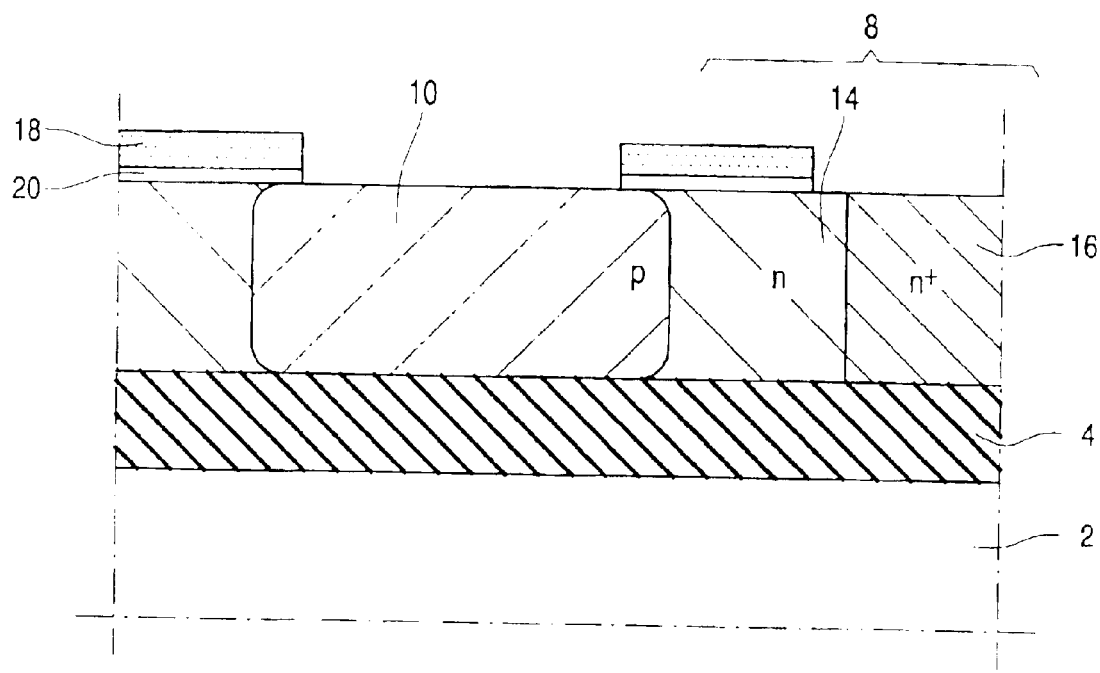
FIGS. 3 to 5 illustrate process steps for manufacturing the field effect transistor of FIG. 2.
Figure 4:
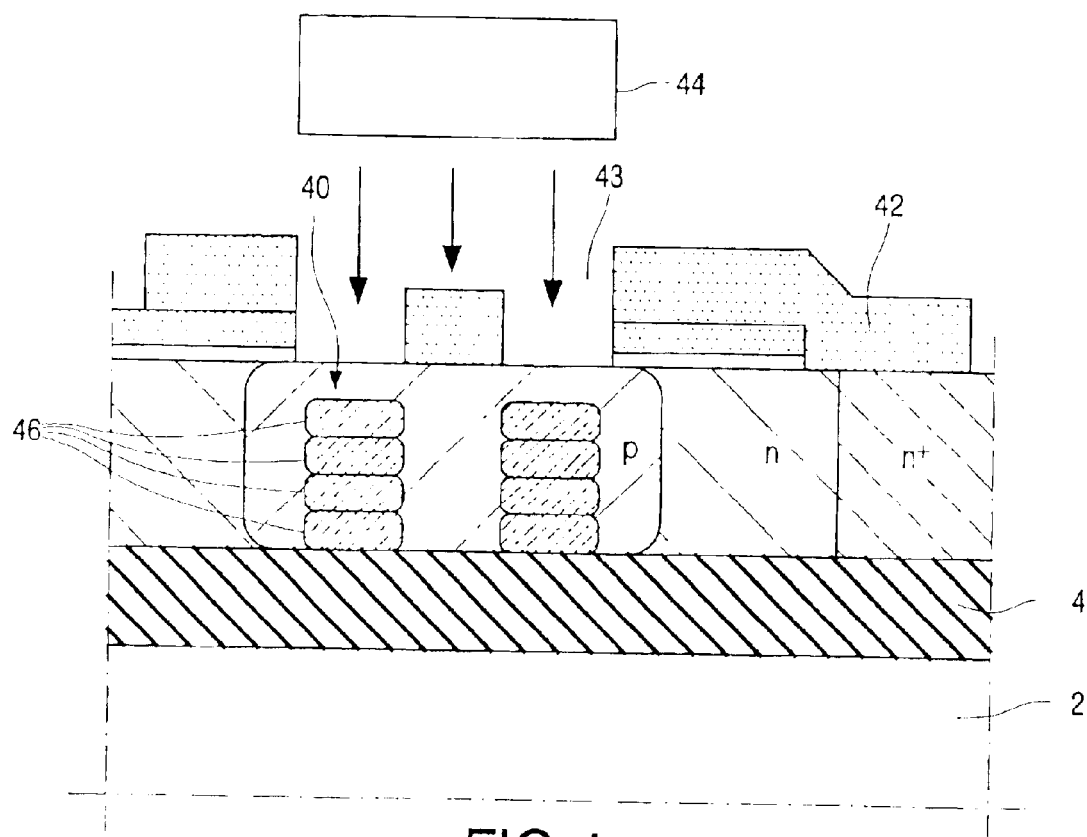
Figure 5:
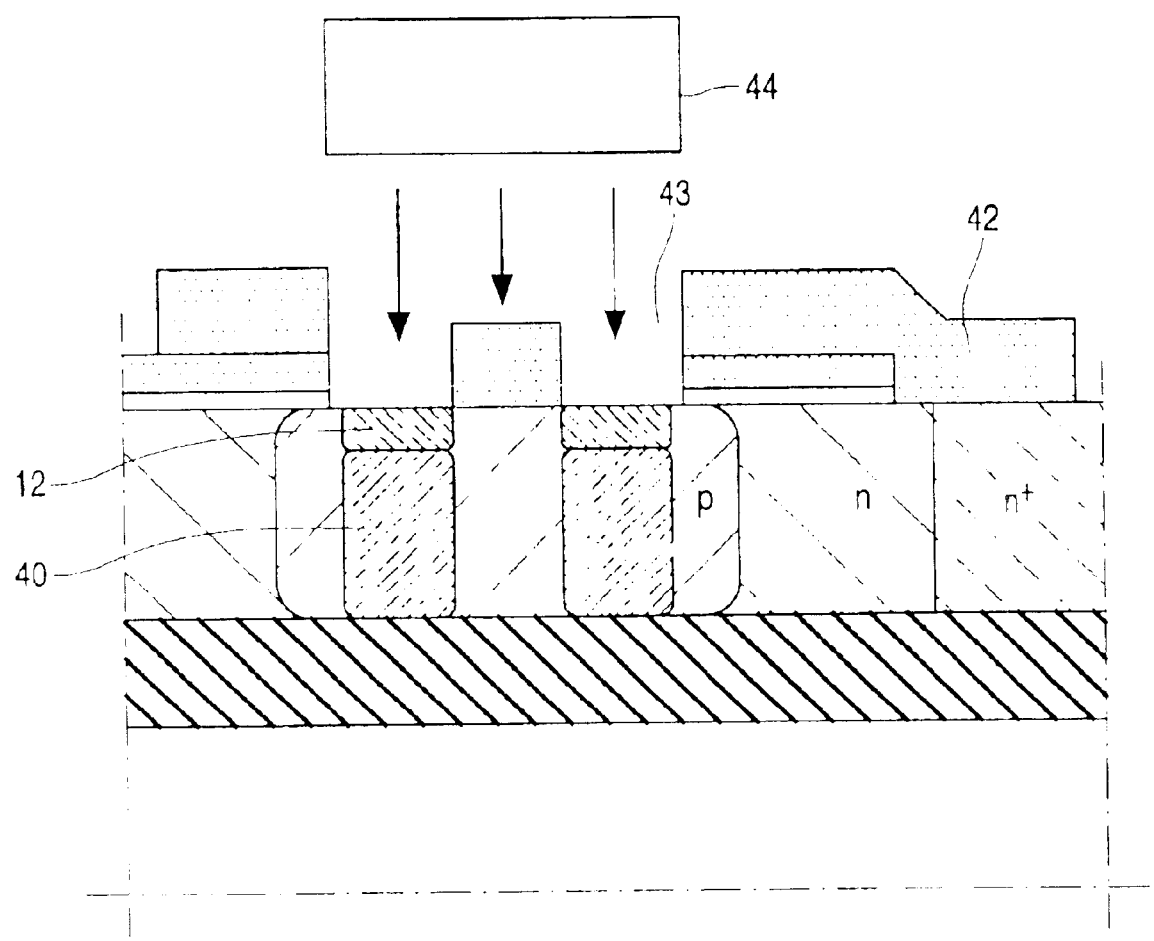

The manufacturing process for manufacturing the transistor will now be described with reference to FIGS. 3 to 5. Firstly, a buried oxide layer 4 is formed on substrate 2 and n-type active layer 6 formed on the buried oxide layer.

A gate insulator 20 is grown over the whole surface followed by polysilicon gate 18. These are then patterned. A body region 10 is then formed by a p-type implant and diffused to arrive at the structure of FIG. 3. It is possible, though not essential to use the polysilicon gate as a mask in this step. These steps are conventional and will not be described further.

A mask 42 is then formed, for example of photoresist, and patterned to define openings 43 defining the source regions. Next, as illustrated in FIG. 4, an ion implanter 44 is used to implant a series of p-type sub-regions 46 through the openings 43. The implantation energy is varied to implant a series of the p-type sub-regions at different depths starting from the oxide layer 4, the p-type sub-regions 46 collectively defining an implant region 40 extending upwards from the buried oxide layer 4.

N type source regions 12 are then implanted at the surface of body 10 through the same openings 43 as used to define the p-type sub-regions 44 so that the source region 12 and p-type sub-regions 44 are laterally aligned. The implantation is done at a lower implantation energy so that the source region is provided at the surface of the body 10.

The p-type implant region 40 and source region 12 are then activated without substantial diffusion. This may be done by heating the device to a temperature which activates the implant and source regions 40,12 without causing large amounts of diffusion. By carrying out both activations in a single step the number of process steps is kept small and the thermal budget of the manufacturing process is not increased by adding the implant region 40. The activated implant region 40 extends from the source region to the buried oxide layer, as illustrated in FIG. 5.

The device is then completed by removing mask 40 and forming the upper layers of the semiconductor device in a conventional manner to arrive at the device shown in FIG. 2.

This manufacturing process is relatively straightforward and uses the same mask for the implant region 40 as the source region 12. This reduces the number of masks required and allows alignment.

The method allows an implant region to be provided that makes the transistor more rugged without affecting the doping in the channel region 19 in the p-type body region 10 and undesirably affecting the threshold voltage of the device.

In alternative embodiments, the p+ implant region 40 may be provided under the source region but not extending as far as the buried oxide layer 4. The implantation step may be controlled to control the gap between buried oxide layer 4 and the p+ implant region 40.

Although the examples use particular doping types for the various regions it will be appreciated by the skilled person that these may be varied according to need. For example, regions described as p-type may be doped n-type, and vice versa, or alternatively just some of the doping types may be changed.

The substrate 2 may be of any suitable type, for example insulating, as in the case of a silicon on insulator structure, semi-insulating, or doped to be conducting.

The metallisations 22, 24 connecting to the source region and drain region may be formed of any convenient material, such as metal, silicide, as will be appreciated by the skilled person, who will also be aware of alternatives for the material of the gate 18 and insulator 20.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

What is claimed is:

1. A method of manufacturing a field effect transistor, the method comprising:

providing body and drain semiconductor regions laterally adjacent on an insulating layer;

defining a source region mask having openings over part of the body region;

implanting through the openings an implant region of the same conductivity type as the body region and more highly doped than the body region, wherein an entirety of the implant region is arranged on the body region of the same conductivity type;

implanting through the openings a source region of opposite conductivity type to the body region at a surface of the body region laterally aligned with and above the implant region so that the implant region is arranged on the body region of the same conductivity type, said implant region being disposed between a source region at one end and the insulating layer at an opposite end; and activating the source and implant regions.

2. A method according to claim 1 wherein the step of implanting the implant region includes implanting the implant region from the insulating layer upwards in the body region.

3. A method according to claim 1 wherein the step of implanting the implant region includes implanting at a variety of implant energies and corresponding implant depths.

4. A method according to claim 3 wherein the step of implanting the implant region includes starting at a high implant energy and reducing the implant energy.

5. A method according to claim 1 wherein the activation step occurs after the steps of implanting the implant region and the source region.

6. A method according to claim 1 wherein the activation step causes minimal diffusion of the implant region.

7. A method according to claim 1 further comprising providing source, gate and drain metallizations connected to the source region and the body region, a gate of the field effect transistor and the drain region, respectively.

8. A method according to claim 1 wherein the implant region extends to the insulating layer.

9. A method according to claim 1 wherein the implant region does not extend to the insulating region.

* * * * *